United States Patent [19]

Takahashi et al.

[11] Patent Number: 5,300,536
[45] Date of Patent: Apr. 5, 1994

[54] CATALYTIC COMPOSITION FOR PHOTOPOLYMERIZATION AND A PHOTOPOLYMERIZABLE COMPOSITION CONTAINING THE SAME

[75] Inventors: Shin Takahashi; Yoshiaki Fujimoto, both of Aichi, Japan

[73] Assignee: Toagosei Chemical Industry Co., Ltd., Tokyo, Japan

[21] Appl. No.: 952,463

[22] Filed: Sep. 28, 1992

Related U.S. Application Data

[63] Continuation of Ser. No. 592,192, Oct. 3, 1990, abandoned.

[30] Foreign Application Priority Data

Oct. 6, 1989 [JP] Japan .................. 1-260198
Oct. 31, 1989 [JP] Japan .................. 1-284289

[51] Int. Cl.$^5$ .............................. C08F 4/32; C08F 4/16
[52] U.S. Cl. ............................... 522/8; 522/12; 522/17; 522/18; 522/27; 522/37; 502/162; 502/167; 502/172; 502/158
[58] Field of Search .................... 522/37, 18, 12, 8, 17, 522/27; 502/172, 162, 167; 430/919; 526/194

[56] References Cited

U.S. PATENT DOCUMENTS

| 2,335,521 | 11/1943 | Lasher ............... 502/172 |
| 2,875,047 | 2/1959 | Oster ............... 522/26 |
| 3,719,650 | 5/1973 | Joy ............... 526/194 |
| 3,753,715 | 8/1973 | Klüpfel et al. ............... 430/281 |
| 4,071,424 | 1/1978 | Dart et al. . |
| 4,089,762 | 5/1978 | Frodsham . |
| 4,101,327 | 7/1978 | Frass ............... 522/63 |
| 4,828,583 | 5/1989 | Oxman et al. ............... 522/15 |
| 4,874,685 | 10/1989 | Adair ............... 430/921 |
| 4,988,607 | 1/1991 | Ali ............... 430/271 |
| 5,041,369 | 8/1991 | Fukui et al. ............... 430/944 |

FOREIGN PATENT DOCUMENTS 0185423 6/1986 European Pat. Off. ............... 522/37

Primary Examiner—Christopher Rodee
Attorney, Agent, or Firm—Wyatt, Gerber, Burke and Badie

[57] ABSTRACT

The present invention relates to a catalytic composition for photopolymerization, which comprises an alpha-diketone and a hydrazone or a silane compound which has a silicon atom carrying a hydrogen, and also relates to a photopolymerizable composition which comprises a vinyl compound capable of radical polymerization and the above catalytic composition. The catalytic composition is markedly improved in photopolymerization activity and the photopolymerizable composition uniformly cures.

8 Claims, No Drawings

CATALYTIC COMPOSITION FOR PHOTOPOLYMERIZATION AND A PHOTOPOLYMERIZABLE COMPOSITION CONTAINING THE SAME

This application is a continuation application of application Ser. No. 07/592,192, filed Oct. 3, 1990 now abandoned.

This invention relates to a catalytic composition for photopolymerization, which comprises an alpha-diketone and a hydrazone or a specific silane compound, and also relates to a photopolymerizable composition which contains the above catalytic composition. The photopolymerizable composition can be used for adhesion, fastening or sealing of metal, ceramic or plastic parts, fixation of joints of such parts, or the like.

Photopolymerizable compositions are compositions which are stable in unhardened state for a long time while light is being shielded, but polymerize and cure in use by exposure to ultraviolet or visible light. As photopolymerizable compositions, conventionally known are those which mainly comprise vinyl compounds capable of radical polymerization and to which photopolymerization catalysts are added.

However, since photopolymerization reaction progresses from the surface which is directly irradiated with light, photopolymerizable compositions harden well on the irradiated surface but tend to insufficiently harden in the deep inside so that unevenness in physical properties occurs in hardened bodies. This tendency is especially pronounced in the case of dental treatment in which visible light, which is minimal in beam energy, is used in view of safety for human body. As a result, vinyl compounds often remain unpolymerized at the boundary between an adherend and a photopolymerizable composition remote from the surface irradiated with light, and thus adequate adhesion to the adherend cannot be obtained, or upon an environmental test, unpolymerized vinyl compounds bleed to cause adhesion strength to gradually decrease.

There are various photopolymerization catalysts, for example, benzoin compounds such as benzoin, benzoin methyl ether and benzoin ethyl ether; carbonyl compounds such as camphorquinone, benzil, benzophenone, acetophenone and Michler's ketone; azo compounds such as azobisisobutyronitrile and azodibenzoyl; sulfur compounds such as dibenzothiazolyl sulfide and tetraethyl thiuram disulfide; and the like. However, since these catalysts are all low in sensitivity, they have not solved the aforementioned problems.

It is an object of the present invention to provide a catalytic composition for photopolymerization and a photopolymerizable composition comprising a vinyl compound capable of radical polymerization, which can solve the aforementioned problems because hardening reaction progresses not only on the directly-irradiated surface but also into the deep inside, upon exposure to ultraviolet or visible light.

As a result of intensive researches to solve the aforementioned problems, the present inventors found that when a composition comprising an alpha-diketone and a hydrazone or a specific silane compound is added to a vinyl compound capable of radical polymerization, hardening reaction rapidly takes place with light irradiation and progresses into the deep inside.

That is, the present invention relates to a catalytic composition for photopolymerization, which comprises an alpha-diketone, a hydrazone or a silane compound in which a silicon atom is linked with a hydrogen atom, and to a photopolymerizable composition which comprises the above catalytic composition and a radical-polymerizable vinyl compound.

Hereinafter, a detailed explanation is given of each ingredient of the present catalytic composition for photopolymerization and of the present photopolymerizable composition containing that catalytic composition.

Alpha-diketones

Alpha-diketones used as a component of the present catalytic composition for photopolymerization are those which function as a photopolymerization initiator absorbing a light within the near-ultraviolet through visible range. Preferred are the compounds shown in the following general formula (A):

wherein X and Y, which may be identical with or different from each other, represent a substituted or unsubstituted alkyl, alkenyl or aryl group, having 1 to 24 carbon atoms, and X and Y may form a ring structure by linking with each other.

Specific examples of the alpha-diketones used in the present invention are camphorquinone, benzil, 1,2-(1-naphtyl)-1,2-ethanedione, acenaphthene quinone; benzil substituted with halogen or alkoxy such as p,p'-dimethoxybenzil and p,p'-dichlorobenzil; biacetyl, pentanedione, 1,2-phenanthrenequinone, 3,4-phenanthrenequinone, 9,10-phenanthrenequinone, and 1,2-naphthoquinone. Among them, especially preferred is camphorquinone. However, the alpha-diketone used in the present invention is not limited only to the above-listed compounds. These compounds may be used singly or in combination with two or more of them.

Hydrazones

Hydrazones are compounds containing in molecule the structure denoted by $-NH-N=C<$, and are used as a component of the present catalytic composition for photopolymerization in combination with alpha-diketones.

Hydrazones, which contain in molecule the structure denoted by $-NH-N=C<$, can readily be obtained by dehydration-condensation of a carbonyl compound having 1–24 carbon atoms and hydrazine or a substituted compound thereof denoted by $Z-NH-NH_2$ wherein Z is a substituted or unsubstituted alkyl, alkenyl, alkylsulfonyl, aryl or arylsulfonyl group, having 1–20 carbon atoms.

The carbonyl compound which is used in synthesis of hydrazones includes camphorquinone, benzil, 1,2-(1-naphtyl)-1,2-ethanedione, acenaphthene quinone; benzil substituted with halogen or alkoxy such as p,p'-dimethoxybenzil and p,p'-dichlorobenzil; biacetyl, 1,2-phenanthrenequinone, 1,4-phenanthrenequinone, 3,4-phenanthrenequinone, 9,10-phenanthrenequinone, naphthoquinone, 2,3-butanedione, 2,3-pentanedione, 1,2-cyclohexanedione, 1,3-cyclohexanedione, acetone, acetaldehyde, butyraldehyde, benzaldehyde, acetophenone, chloroacetophenone, trifluoroacetophenone, benzophenone, benzoin, benzoin methyl ether, and benzoin isopropyl ether. However, these compounds are merely examples.

Examples of hydrazine or its substituted compounds are p-toluenesulfonylhydrazide, 4,4'-oxybis(benzenesulfonylhydrazide), benzenesulfonylhydrazide, benzoic hydrazide, succinic dihydrazide, oxamic hydrazide, methylhydrazine, and phenylhydrazine. However, these compounds are merely examples.

In the present invention, any of the reaction products of such carbonyl compounds and hydrazine or substituted compounds thereof as mentioned above may be used as a hydrazone. However, preferred are camphorquinone p-toluenesulfonylhydrazone which is a reaction product of camphorquinone and p-toluenesulfonylhydrazide, and the following reaction products of carbonyl compounds and substituted compounds of hydrazine: a reaction product of camphorquinone as carbonyl compound and 4,4'-oxybis(benzenesulfonylhydrazide), benzoic hydrazide or benzenesulfonylhydrazide as substituted hydrazine; a reaction product of benzil as carbonyl compound and p-toluenesulfonylhydrazide, oxamic hydrazide, benzoic hydrazide or 4,4'-oxybis(benzenesulfonylhydrazide) as substituted hydrazine; a reaction product of acetone as carbonyl compound and p-toluenesulfonylhydrazide or oxamic hydrazide as substituted hydrazine; a reaction product of acetaldehyde, benzaldehyde, acetophenone, chloroacetophenone, trifluoroacetophenone or the like as carbonyl compound and p-toluenesulfonylhydrazide as substituted hydrazine; a reaction product of 2,3-pentanedione as carbonyl compound and p-toluenesulfonylhydrazide as substituted hydrazine; and a reaction product of 2,3-butanedione as carbonyl compound and p-toluenesulfonylhydrazide as substituted hydrazine.

In the present invention, the above-mentioned compounds may be used alone or in combination with two or more thereof.

Silane compounds

Silane compounds having a silicon atom which carries a hydrogen atom are used as a component of the present catalytic composition for photopolymerization in combination with alpha-diketones. The silane compounds have, in molecule, a structure of —SiHRaRb or —SiHRc— wherein Ra, Rb and Rc, which may be identical with or different from each other, represent a hydrogen or a substituted or unsubstituted alkyl, alkenyl, aryl, alkoxy, acyloxy or amino group, having 1-22 carbon atoms.

For example, a silane compound which contains in molecule two or more silicon atoms possesses a linkage such as —Si—Si— and —Si—Z—Si— wherein Z is a di- or more valent residue such as of oxygen, nitrogen, an alkyl group and an aryl group. In this case, the present invention requires such a silane compound to be one in which at least one of their silicon atoms have the structure of "—SiHRaRb" or "—SiHRc—".

In addition to Ra, Rb and Rc, silicon atoms may carry any element in the silane compounds. However, a silane compound in which a silicon atom carries a halogen atom such as chlorine is not preferred because the halogen atom tends to deteriorate the effect of photopolymerization acceleration.

The number of the silicon atoms contained in one molecule of the silane compound is not limited. In the present invention, preferred examples of the silane compounds are methyl silane, ethyl silane, butyl silane, hexyl silane, ethyldimethyl silane, diethyl silane, trimethyl silane, triethyl silane, hexyl silane, octadecyl silane, phenyl silane, diphenyl silane, triphenyl silane, methylphenyl silane, phenyldimethyl silane, diphenylmethyl silane, phenyldiethyl silane, phenyldipropyl silane, benzyldimethyl silane, p-bis(dimethylsilyl)benzene, 1,1,1-trimethyldisilane, tris(dimethylsilyl)amine, diethyl(dimethylsilyl)amine, methyldiacetoxy silane, hexamethyl-1,5-dihydrotrisiloxyane, methyldimethoxy silane, dimethylethoxy silane, diethoxy silane and triethoxy silane. However, these compounds are merely examples.

Silane coupling agents, which are used to enhance adhesion between organic substances and inorganic substances, are similar in structure to the silane compounds of the present invention. However, the silane coupling agents cannot be used in the present invention nor expected to achieve the effect of the present invention because they do not have any silicon atom which carries a hydrogen atom.

In the present invention, silane compounds as listed above may be used singly or in combination with two or more thereof.

Composition ratio

Composition ratio of the alpha-diketone and the hydrazone or the silane compound, which constitute the present catalytic composition for photopolymerization, depends upon conditions in use. Preferably, the present catalytic composition comprises 1–99% by weight of alpha-diketone and 99–1% by weight of hydrazone or silane compound. More preferably, it comprises 2–90% by weight of alpha-diketone and 98–10% by weight of hydrazone or silane compound.

When the present catalytic composition is employed for photopolymerization of a vinyl compound capable of radical polymerization, the amount of the former to be added to the latter depends on conditions in use. Usually, the present catalytic composition for photopolymerization is added in an amount of preferably 0.01–30 parts by weight, more preferably 0.05–20 parts by weight, most preferably 0.05–10 parts by weight based on 100 parts by weight of the vinyl compound.

It is not clear how the photopolymerization accelerators used in the present invention function upon polymerization. It is, however, assumed that the photopolymerization accelerators promote radical initiation caused by dehydrogenation or decomposition of alpha-diketones excited by absorption of light within the near-ultraviolet to visible range.

Vinyl compounds capable of radical polymerization

Any vinyl compound can be used in the present invention as long as it can be radical-polymerized by addition of the present catalytic composition for photopolymerization and irradiation of light. Specific examples of the vinyl compounds are shown below:

Vinyl compounds (1)

(Meth)acrylates shown by the following formula (1).

wherein $R^1$ is hydrogen or —$CH_3$, $R^2$ is a straight- or branched-chain alkyl group of 2–4 carbon atoms in which at least one hydrogen atom is substituted with —OH group and/or halogen atom.

Examples of the (meth)acrylates of the formula (1) are 2-hydroxyethyl(meth)acrylate, 2-hydroxypropyl(- meth)acrylate, 1,2-dihydroxyethyl(meth)acrylate, 3-chloro-2-hydroxypropyl(meth)acrylate and the like.

Vinyl compounds (2)

(Meth)acrylates shown by the following formula (2).

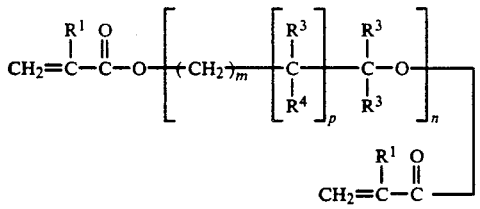

wherein $R^3$ is hydrogen, —$CH_3$, —$C_2H_5$, $CH_2OH$ or

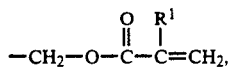

$R^4$ is hydrogen, OH,

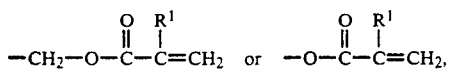

m is an integer of 1-8, n is an integer of 1-20, and p is 0 or 1.

Examples of the (meth)acrylates of the formula (2) are diethyleneglycol di(meth)acrylate, triethyleneglycol di(meth)acrylate, tetraethyleneglycol di(meth)acrylate, 1,2-propyleneglycol di(meth)acrylate, dipropyleneglycol di(meth)acrylate, polyethyleneglycol di(meth)acrylate, glycerol di(meth)acrylate, glycerolacrylate methacrylate, diglycerol di(meth)acrylate, glycerin tri(meth)acrylate, trimethylolpropane tri(meth)acrylate, di-glycerol tetra(meth)acrylate and the like.

Vinyl compounds (3)

(Meth)acrylates shown by the following formula (3).

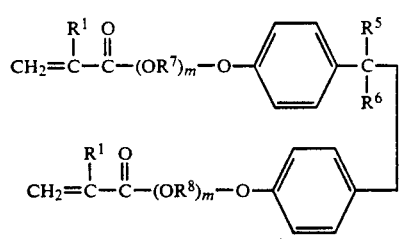

wherein $R^5$ and $R^6$ are hydrogen, an alkyl group having 1-8 carbon atoms, $R^7$ and $R^8$ are a hydrocarbon residue having 2-8 carbon atoms, and m is an integer of 1-10.

Examples of the (meth)acrylates of the formula (3) are 2,2-bis(4-methacryloxydiethoxyphenyl)propane, 2,2-bis(4-acryloxydiethoxyphenyl)propane, 2,2-bis(4-methacryloxytriethoxyphenyl)propane, 2,2-bis(4-acryloxypentaethoxyphenyl)propane, 2,2-bis(4-methacryloxyhexaethoxyphenyl)propane, 2,2-bis(4-acryloxyheptaethoxyphenyl)propane, 2,2-bis(4-methacryloxyoctaethoxyphenyl)propane, 2,2-bis(4-acryloxydipropoxyphenyl)propane, 2,2-bis(4-methacryloxytripropoxyphenyl)propane, 2,2-bis(4-acryloxydibutoxyphenyl)propane, 2,2-bis(4-methacryloxyoctabutoxyphenyl)propane, 2-(4-methacryloxydiethoxyphenyl)-2-(4-methacryloxytriethoxyphenyl)propane, 2-(4-acryloxydipropoxyphenyl)-2-(4-acryloxytriethoxyphenyl)propane, and the like.

Vinyl compounds (4)

(Meth) acrylates shown by the following formula (4).

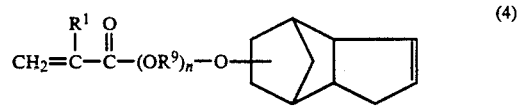

wherein $R^9$ is hydrogen or a hydrocarbon residue having 1-4 carbon atoms, and n is 0 or an integer of 1-10.

Examples of the (meth)acrylates of the formula (4) are dicyclopentenyl (meth)acrylate, dicyclopentenyloxymethyl (meth)acrylate, dicyclopentenyloxyethyl (meth)acrylate, dicyclopentenyloxypropyl (meth)acrylate, and the like.

Vinyl compounds (5)

(Meth)acrylates shown by the following formula (5).

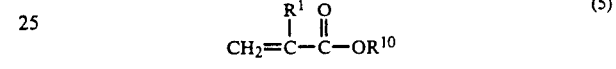

wherein $R^{10}$ is hydrogen, an alkyl group having 1-18 carbon atoms, a cycloalkyl group having 5-20 carbon atoms, a phenyl group, a tetrahydrofurfurly group, or an alkyl group of 5-20 carbon atoms which contains a phenyl or tetrahydrofurfurly group.

Examples of the (meth)acrylates of the formula (5) are methacrylic acid, acrylic acid, methyl (meth)acrylate, cyclohexyl (meth)acrylate, tetrahydrofurfurly (meth)acrylate, 2-ethylhexyl (meth)acrylate, phenyl (meth)acrylate, benzyl (meth)acrylate, and the like.

Vinyl compounds (6)

(Meth)acrylates shown by the following formula (6).

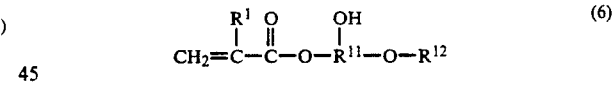

wherein $R^{11}$ is a hydrocarbon residue having 2-18 carbon atoms, and $R^{12}$ is a hydrocarbon residue having 1-18 carbon atoms.

Examples of the (meth)acrylates of the formula (6) are 2-hydroxy-3-phenoxypropyl (meth)acrylate, cyclohexanoxy-$\beta$-hydroxypropyl (meth)acrylate, tetrahydrofurfurloxy-$\beta$-hydroxypropyl (meth)acrylate, nonyloxy-$\beta$-hydroxypropyl (meth)acrylate, and the like.

Vinyl compounds (7)

(Meth)acrylates shown by the following formula (7).

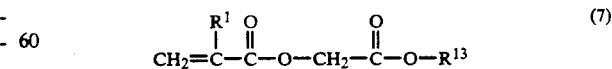

wherein $R^{13}$ is an alkyl group having 1-20 carbon atoms, a vinyl group, an aryl group and an alkoxyalkyl group.

Examples of the (meth)acrylates of the formula (7) are methoxycarbonylmethyl (meth)acrylate, ethoxycarbonylmethyl (meth)acrylate, heptoxycarbonylmethyl (meth)acrylate, isopropoxycarbonylmethyl (meth)acrylate, and the like.

Vinyl compounds (8)

(Meth)acrylates shown by the following formula (8).

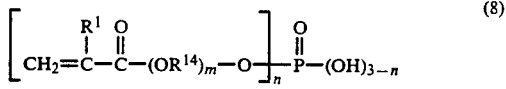

wherein $R^{14}$ is a hydrocarbon residue of 1–20 carbon atoms, m is an integer of 1–10, and n is 1 or 2.

Vinyl compounds (9)

(Meth)acrylates shown in the following formula (9).

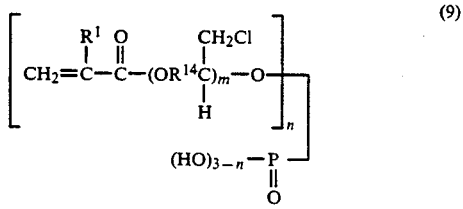

wherein m is an integer of 1–10, and n is 1 or 2.

Examples of the (meth)acrylates of the formulas (8) and (9) are acidphosphoxyethyl (meth)acrylate, 3-chloro-2-acidphosphoxypropyl (meth)acrylate, acidphosphoxypropyl (meth)acrylate, and the like.

Vinyl compounds (10)

Urethane prepolymers having a (meth)acryloyloxy group, as mentioned in (10-1) and (10-2) below:

(10-1): An urethane prepolymer having a (meth)acryloyloxy group, which is a reaction product of a (meth)acrylate having a hydroxy group and an organic polyisocyanate.

(10-2): An urethane prepolymer having a (meth)acryloyloxy group, which is a reaction product of a (meth)acrylate having a hydroxy group, an organic polyisocyanate and a tri- or more- valent polyol and/or diol.

Other vinyl compounds

Aside from the aforementioned vinyl compounds, the catalytic composition for photopolymerization of the present invention can be combined with various other vinyl compounds, for example, a vinyl ester such as vinyl acetate and vinyl propionate; a vinyl ether such as methyl vinyl ether, ethyl vinyl ether and cyclohexyl vinyl ether; and alkenyl benzene such as styrene, vinyltoluene, alpha-methyl styrene, chloromethyl styrene and stilbenzene; N-vinyl pyrrolidone; and a carboxylic acid such as maleic acid, maleic acid anhydride. However, these compounds are merely examples.

The above-mentioned vinyl compounds capable of radical polymerization may be used singly or in combination with two or more thereof.

Additives

Besides the aforementioned components, various substances may be added to the present composition for different purposes. For example, a nitro compound, a nitroso compound or a quinone such as hydroquinone and hydroquinone monomethyl ether may be added for improving stability; a dye or pigment may be added for coloring; a thixotropic agent such as silica may be added for imparting thixotropic property; a chelating agent such as ethylenediaminetetraacetic acid and its salt; and an acrylic, urethane or epoxy resin or silica may be added for increasing viscosity and volume.

In addition, an organic peroxide can be added to impart thermal polymerization property or anaerobic polymerization property.

The present photopolymerizable composition can readily be prepared by mixing and dissolving the aforementioned components under room temperature or elevated temperature.

Curing methods

The present photopolymerizable composition to which the present catalytic composition for photopolymerization is added may be cured in the same manner as conventionally employed. Light source may be high-pressure mercury lamp, metal halide lamp, xenon lamp halogen lamp, fluorescent lamp, or incandescent lamp.

EXAMPLES AND COMPARATIVE EXAMPLES

Hereinafter, the present invention will be set forth in more detail by way of the following examples and comparative examples, but the present invention is not limited to these examples.

Firstly, hydrazones were synthesized in the following ways.

SYNTHESIS EXAMPLE 1

A 100 ml pear-shaped flask was charged with 50 ml of ethanol, 0.03 mol of p-toluenesulfonylhydrazide and 0.03 mol of camphorquinone. In addition, a rotator was placed in the flask, and the flask was equipped with a condenser. While the raw materials were stirred with a magnetic stirrer, the reaction liquid was heated with a water bath until ethanol was boiled and refluxed, and then, under this condition, the reaction liquid was allowed to react for about 8 hours.

After ethanol was removed from the reaction liquid under vacuum, a viscous substance was obtained at 60° C. In GPC analysis, this substance (camphorquinone p-toluenesulfonylhydrazone) showed substantially two peaks on the side of molecular weight higher than the two raw materials.

In NMR analysis, the broad peak near 5.5 ppm of p-toluenesulfonylhydrazide disappeared, but instead a sharp quadruple line of the hydrazone compounds appeared at 3.6 ppm to 3.8 ppm.

SYNTHESIS EXAMPLE 2

A 100 ml pear-shaped flask was charged with 40 ml of ethanol, 0.03 mol of p-toluenesulfonylhydrazide and 0.15 mol of acetone. In addition, a rotator was place in the flask, and the flask was equipped with a condenser. While the raw materials were stirred with a magnetic stirrer, the reaction liquid was heated with a water bath until ethanol was boiled and refluxed, and then under this condition, the reaction liquid was allowed to react for about 8 hours.

After ethanol and excess acetone were removed from the reaction liquid by vacuum, a powdery substance (4,4'-oxybis(benzenesulfonylhydrazono acetone)) was obtained at room temperature. In GPC analysis, this substance showed a substantially single peak on the side of molecular weight higher than the two raw materials.

In NMR analysis, the broad peak near 5.5 ppm of p-toluenesulfonylhydrazide disappeared, but instead a sharp double line of the hydrazone compounds appeared at 2.16 ppm to 2.22 ppm.

SYNTHESIS EXAMPLE 3

A 100 ml pear-shaped flask was charged with 40 ml of ethanol, 0.01 mol of 4,4'-oxybenzenesulfonylhydrazide and 0.01 mol of camphorquinone. In addition, a rotator was placed in the flask, and the flask was equipped with a condenser. While the raw materials were stirred with a magnetic stirrer, the reaction liquid was heated with a water bath until ethanol was boiled and refluxed, and then, under this condition, the reaction liquid was allowed to react for about 8 hours.

After ethanol was removed from the reaction liquid under vacuum, a yellow semi-solid substance (4,4'-oxybis(benzenesulfonylhydrazono camphorquinone)) was obtained at room temperature. In GPC analysis, this substance showed a substantially single peak on the side of molecular weight higher than the two raw materials.

In IR analysis, the peak of C=O of camphorquinone at 5.75 $\mu$m was partially shifted to 5.9 $\mu$m.

SYNTHESIS EXAMPLE 4

A 100 ml pear-shaped flask was charged with 50 ml of ethanol, 0.03 mol of p-toluenesulfonylhydrazide and 0.015 mol of 2,3-butanedione. In addition, a rotator was placed in the flask, and the flask was equipped with a condenser. While the raw materials were stirred with a magnetic stirrer, the reaction liquid was heated with a water bath until ethanol was boiled and refluxed, and then, under this condition, the reaction liquid was allowed to react for about 8 hours.

After ethanol was removed from the reaction liquid under vacuum, a powdery substance (butanedione p-toluenesulfonyl hydrazone) was obtained at room temperature. In GPC analysis, this substance showed a substantially single peak on the side of molecular weight higher than the two raw materials.

In NMR analysis, the broad peak near 5.5 ppm of p-toluenesulfonylhydrazide disappeared, but instead a single sharp peak of the hydrazone compounds appeared at 8.52 ppm.

SYNTHESIS EXAMPLE 5

A 100 ml pear-shaped flask shielded with covering of aluminum foil was charged with 50 ml of ethanol, 0.055 mol of p-toluenesulfonylhydrazide and 0.055 mol of benzaldehyde. In addition, a rotator was placed in the flask, and the flask was equipped with a condenser. While the raw materials were stirred with a magnetic stirrer, the reaction liquid was heated with a water bath until ethanol was boiled and refluxed, and then, under this condition, the reaction liquid was allowed to react for about 8 hours. After the reaction liquid was cooled to room temperature and 200 ml of petroleum ether was added thereto, white precipitate was obtained at room temperature.

The precipitate was filtered with a glass filter and dried to obtain a white powder. In GPC analysis, this substance showed a substantially single peak on the side of molecular weight higher than the two raw materials.

SYNTHESIS EXAMPLE 6

A 200 ml pear-shaped flask shielded with covering of aluminum foil was charged with 100 ml of ethanol, 0.019 mol of 4,4'-oxybis(benzenesulfonylhydrazide) and 0.038 mol of benzoin ethyl ether. In addition, a rotator was placed in the flask, and the flask was equipped with a condenser. While the raw materials were stirred with a magnetic stirrer, the reaction liquid was heated with a water bath until ethanol was boiled and refluxed, and then, under this condition, the reaction liquid was allowed to react for about 8 hours.

After ethanol was removed from the reaction liquid under vacuum, a pale yellow solid substance was obtained at room temperature. In GPC analysis, this substance showed a substantially single peak on the side of molecular weight higher than the two raw materials.

SYNTHESIS EXAMPLE 7

A 200 ml pear-shaped flask shielded with covering of aluminum foil was charged with 100 ml of ethanol, 0.019 mol of 4,4'-oxybis(benzenesulfonylhydrazide) and 0.038 mol of benzoin isobutyl ether. In addition, a rotator was placed in the flask, and the flask was equipped with a condenser. While the raw materials were stirred with a magnetic stirrer, the reaction liquid was heated with a water bath until ethanol was boiled and refluxed, and then, under this condition, the reaction liquid was allowed to react for about 8 hours.

After ethanol was removed from the reaction liquid under vacuum, a pale yellow solid substance was obtained at room temperature. In GPC analysis, this substance showed a substantially single peak on the side of molecular weight higher than the two raw materials.

SYNTHESIS EXAMPLE 8

A 200 ml pear-shaped flask was charged with 50 ml of ethanol, 0.047 mol of benzenesulfonylhydrazide and 0.047 mol of camphorquinone. In addition, a rotator was placed in the flask, and the flask was equipped with a condenser. While the raw materials were stirred with a magnetic stirrer, the reaction liquid was heated with a water bath until ethanol was boiled and refluxed, and then, under this condition, the reaction liquid was allowed to react for about 8 hours.

After ethanol was removed from the reaction liquid under vacuum, a highly-viscous, orange-colored liquid substance was obtained at room temperature. In GPC analysis, this substance showed substantially two peaks on the side of molecular weight higher than the two raw materials.

EXAMPLES 1-9 AND COMPARATIVE EXAMPLE 1

Photopolymerizable compositions were prepared by covering the outside of containers with aluminum foil to shield light as mentioned below, putting therein 100 parts by weight of trimethylolpropane triacrylate and prescribed photopolymerization catalysts as shown in Table 1, and mixing them under stirring at a heated temperature of 80° C. to obtain uniform liquid mixtures. The photopolymerizable compositions thus obtained were subjected to a test for thick film cureability and a measurement of hardness of hardened bodies in order to evaluate photopolymerizable property.

Evaluation of photopolymerization property

Test method for thick film cureability (1) Preparing a polyethylene tube which is 5 mm in inner diameter and 40 mm in length and which is open at the top end and is closed at the bottom end by a cap. Covering the outside of the polyethylene tube with aluminum foil to shield light.

(2) Putting a photopolymerizable composition into the tube up to the top end.

(3) Irradiating with light at a location of 2 mm above the surface of the photopolymerizable composition for 10 seconds, and then measuring a thickness of the hardened photopolymerizable composition.

As a light irradiating apparatus, the following was used:
Manufacturer: SHOFU
Unit type: Daylight lamp 2, optical fiber type
Lamp used: Sylvania EFR/15 V-150 W having the following specification of illuminance at the three different wavelengths; 0.08 mw/cm² at 365 nm, 251 mw/cm² at 405 nm, 41 mw/cm² at 436 nm.

Method for evaluating hardness of hardened bodies (1) Preparing a polyethylene tube which is 5 mm in inner diameter and 4 mm in depth and which is open at the top end and closed at the bottom end by a cap.

(2) Putting a photopolymerizable composition into the tube up to the top end.

(3) Irradiating with light at a location of 2 mm above the surface of the photopolymerizable composition for 10 seconds, taking the hardened body of the photopolymerizable composition out of the tube, and then measuring the hardness of the upper surface (which was the side irradiated with light) of the hardened body and the hardness of the lower surface of the hardened body by use of a Shore hardness gauge. The light irradiating apparatus is the same as used in the above test method for thick film cureability. The hardness gauge used is the following:
Manufacturer: Ueshima Seisakusho
Model: HD-104N
Type: SHORE D
Standard: ASTM D 2240

The results of the evaluation of the photopolymerizable compositions are shown in Table 2.

TABLE 1

| | Photopolymerizable compositions | | | | | | | | | |
|---|---|---|---|---|---|---|---|---|---|---|
| | Example Nos. | | | | | | | | | Comparative Example No. |
| | 1 | 2 | 3 | 4 | 5 | 6 | 7 | 8 | 9 | 1 |
| Camphorquinone | 0.3 | 0.1 | 0.3 | 0.1 | 0.3 | 0.1 | 0.3 | 0.1 | 0.3 | 0.8 |
| Hydrazone obtained in Synthesis Example 1 | 3 | 3 | 0 | 0 | 0 | 0 | 0 | 0 | 0 | 0 |
| Hydrazone obtained in Synthesis Example 2 | 0 | 0 | 3 | 3 | 0 | 0 | 0 | 0 | 0 | 0 |
| Hydrazone obtained in Synthesis Example 3 | 0 | 0 | 0 | 0 | 3 | 3 | 0 | 0 | 0 | 0 |
| Hydrazone obtained in Synthesis Example 4 | 0 | 0 | 0 | 0 | 0 | 0 | 3 | 3 | 1 | 0 |
| Trimethylolpropane triacrylate | 100 | 100 | 100 | 100 | 100 | 100 | 100 | 100 | 100 | 100 |

TABLE 2

| | Photopolymerizable compositions | | | | | | | | | |
|---|---|---|---|---|---|---|---|---|---|---|
| Items of evaluation of Photopolymerizability | Example Nos. | | | | | | | | | Comparative Example No. |
| | 1 | 2 | 3 | 4 | 5 | 6 | 7 | 8 | 9 | 1 |
| Thickness of cured films (mm) | 10 | 11 | 15 | 18 | 40 | 40 | 14 | 11 | 11 | 3 |
| Shore hardness of the upper surface of hardened bodies | 93 | 96 | 88 | 86 | 89 | 90 | 91 | 95 | 96 | 93 |
| Shore hardness of the lower surface of hardened bodies | 79 | 94 | 70 | 75 | 86 | 83 | 86 | 83 | 90 | 8 |

EXAMPLES 10-27 AND COMPARATIVE EXAMPLES 1-2

Photopolymerizable compositions were prepared using camphorquinone as alpha-diketone in the same manner as in Example 1 except that various silane compounds were used as shown in Table 3. These photopolymerizable compositions were subjected to the same tests of thick film cureability and hardness of hardened bodies as in Example 1, to evaluate photopolymerization property. The results of the evaluation are shown in Table 4.

TABLE 3

| | Photopolymerizable compositions | | | | | | | | | |
|---|---|---|---|---|---|---|---|---|---|---|
| Component (I) or Component (II) | Example Nos. | | | | | | | | | |
| | 10 | 11 | 12 | 13 | 14 | 15 | 16 | 17 | 18 | 19 |
| Camphorquinone | 0.8 | 0.8 | 0.8 | 0.8 | 0.8 | 0.8 | 0.8 | 0.8 | 0.8 | 0.8 |
| Triphenyl silane | 0.5 | 2 | 5 | 10 | 0 | 0 | 0 | 0 | 0 | 0 |
| Triethyl silane | 0 | 0 | 0 | 0 | 0.5 | 2 | 0 | 0 | 0 | 0 |
| Phenyldimethyl silane | 0 | 0 | 0 | 0 | 0 | 0 | 0.5 | 2 | 0 | 0 |
| Phenyl silane | 0 | 0 | 0 | 0 | 0 | 0 | 0 | 0 | 0.5 | 2 |
| Diethyl silane | 0 | 0 | 0 | 0 | 0 | 0 | 0 | 0 | 0 | 0 |
| P-BDS-B*1 | 0 | 0 | 0 | 0 | 0 | 0 | 0 | 0 | 0 | 0 |
| n-hexyl silane | 0 | 0 | 0 | 0 | 0 | 0 | 0 | 0 | 0 | 0 |
| n-octadecyl silane | 0 | 0 | 0 | 0 | 0 | 0 | 0 | 0 | 0 | 0 |
| tris(dimethylsilyl)amine | 0 | 0 | 0 | 0 | 0 | 0 | 0 | 0 | 0 | 0 |
| HM-DH-TS*2 | 0 | 0 | 0 | 0 | 0 | 0 | 0 | 0 | 0 | 0 |
| Methyldiacetoxy silane | 0 | 0 | 0 | 0 | 0 | 0 | 0 | 0 | 0 | 0 |
| Triethoxy silane | 0 | 0 | 0 | 0 | 0 | 0 | 0 | 0 | 0 | 0 |

TABLE 3-continued

| | | | | | | | | | | |
|---|---|---|---|---|---|---|---|---|---|---|
| Trimethylolpropane triacrylate | 100 | 100 | 100 | 100 | 100 | 100 | 100 | 100 | 100 | 100 |

| | Photopolymerizable compositions | | | | | | | | | |
|---|---|---|---|---|---|---|---|---|---|---|
| Component (I) or | Example Nos. | | | | | | | | Comparative Example No. | |
| Component (II) | 20 | 21 | 22 | 23 | 24 | 25 | 26 | 27 | 1 | 2 |
| Camphorquinone | 0.4 | 0.4 | 0.4 | 0.4 | 0.4 | 0.4 | 0.4 | 0.4 | 0.8 | 0.4 |
| Triphenyl silane | 0 | 0 | 0 | 0 | 0 | 0 | 0 | 0 | 0 | 0 |
| Triethyl silane | 0 | 0 | 0 | 0 | 0 | 0 | 0 | 0 | 0 | 0 |
| Phenyldimethyl silane | 0 | 0 | 0 | 0 | 0 | 0 | 0 | 0 | 0 | 0 |
| Phenyl silane | 0 | 0 | 0 | 0 | 0 | 0 | 0 | 0 | 0 | 0 |
| Diethyl silane | 1.0 | 0 | 0 | 0 | 0 | 0 | 0 | 0 | 0 | 0 |
| P-BDS-B[*1] | 0 | 1.0 | 0 | 0 | 0 | 0 | 0 | 0 | 0 | 0 |
| n-hexyl silane | 0 | 0 | 1.0 | 0 | 0 | 0 | 0 | 0 | 0 | 0 |
| n-octadecyl silane | 0 | 0 | 0 | 1.0 | 0 | 0 | 0 | 0 | 0 | 0 |
| tris(dimethylsilyl)amine | 0 | 0 | 0 | 0 | 1.0 | 0 | 0 | 0 | 0 | 0 |
| HM-DH-TS[*2] | 0 | 0 | 0 | 0 | 0 | 1.0 | 0 | 0 | 0 | 0 |
| Methyldiacetoxy silane | 0 | 0 | 0 | 0 | 0 | 0 | 1.0 | 0 | 0 | 0 |
| Triethoxy silane | 0 | 0 | 0 | 0 | 0 | 0 | 0 | 1.0 | 0 | 0 |
| Trimethylolpropane triacrylate | 100 | 100 | 100 | 100 | 100 | 100 | 100 | 100 | 100 | 100 |

[*1]P-BDS-B: p-bis(dimethylsilyl)benzene
[*2]HM-DH-TS: hexamethyl-1,5-dihydrotrisiloxyane

TABLE 4

| | Photopolymerizable compositions | | | | | | | | | | | | | | | | | | |
|---|---|---|---|---|---|---|---|---|---|---|---|---|---|---|---|---|---|---|---|
| Items of evaluation of | Example Nos. | | | | | | | | | | | | | | | | | Comparative Example No. | |
| photopolymerizability | 10 | 11 | 12 | 13 | 14 | 15 | 16 | 17 | 18 | 19 | 20 | 21 | 22 | 23 | 24 | 25 | 26 | 27 | 1 | 2 |
| Thickness of cured films (mm) | 6 | 14 | 8 | 9 | 9 | 9 | 14 | 14 | 10 | 12 | 13 | 12 | 12 | 10 | 8 | 11 | 10 | 10 | 3 | 6 |
| Shore hardness of the upper surface of hardened bodies | 90 | 90 | 94 | 92 | 93 | 93 | 90 | 91 | 96 | 96 | 90 | 91 | 93 | 88 | 90 | 92 | 91 | 90 | 93 | 79 |
| Shore hardness of the lower surface of hardened bodies | 60 | 85 | 80 | 84 | 72 | 88 | 75 | 84 | 90 | 92 | 88 | 88 | 89 | 86 | 87 | 82 | 80 | 62 | 8 | 11 |

EXAMPLES 28–39

Photopolymerizable compositions containing two different alpha-diketones were prepared in the same manner as in Example 1 except that the components shown in Table 5 were used.

These photopolymerizable compositions were subjected to the same tests of thick film cureability and hardness of hardened bodies as in Example 1, to evaluate photopolymerization property. The results of the evaluation are also shown in Table 5.

EXAMPLES 40–43 AND COMPARATIVE EXAMPLES 3–6

Photopolymerizable compositions were prepared in the same manner as in Example 10 except that alpha-diketones and/or silane compounds and various radical-polymerizable vinyl compounds were used as shown in Table 6.

These photopolymerizable compositions were subjected to the same tests of thick film cureability and hardness of hardened bodies as in Example 1, to evaluate photopolymerization property. The results of the evaluation are also shown in Table 6.

EXAMPLES 44–45 AND COMPARATIVE EXAMPLES 7–11

Photopolymerizable compositions were prepared in the same manner as in Example 10 except that alpha-diketones and/or hydrazones and various radical-polymerizable vinyl compounds were used as shown in Table 7.

These photopolymerizable compositions were subjected to the same tests of thick film cureability and hardness of hardened bodies as in Example 1, to evaluate photopolymerization property. The results of the evaluation are also shown in Table 7.

EXAMPLES 56–59 AND COMPARATIVE EXAMPLES 12–14

Photopolymerizable compositions containing alpha-diketones and hydrazones, silane compounds or known amine compounds were prepared by blending together the components shown in Table 8.

These photopolymerizable compositions were subjected to the same tests of thick film cureability and hardness of hardened bodies as in Example 1, to compare the present photopolymerization catalysts with the known catalysts in terms of photopolymerization property. The results of the evaluation are also shown in Table 8.

TABLE 5

| | Example Nos. | | | | | | | | | | | |
|---|---|---|---|---|---|---|---|---|---|---|---|---|
| | 28 | 29 | 30 | 31 | 32 | 33 | 34 | 35 | 36 | 37 | 38 | 39 |
| Components of compositions | | | | | | | | | | | | |
| Camphorquinone | 0.3 | 0.2 | 0.3 | 0.2 | 0.3 | 0.2 | 0.3 | 0.2 | 0.3 | 0.2 | 0.3 | 0.2 |
| Benzil | 0.1 | 0.2 | 0 | 0 | 0.1 | 0.2 | 0 | 0 | 0 | 0 | 0 | 0 |
| Acenaphthenequinone | 0 | 0 | 0.1 | 0.2 | 0 | 0 | 0.1 | 0.2 | 0 | 0 | 0 | 0 |
| 3-Methyl-1,2-cyclopentanedione | 0 | 0 | 0 | 0 | 0 | 0 | 0 | 0 | 0.1 | 0.2 | 0.1 | 0.2 |
| Triphenyl silane | 2 | 2 | 2 | 2 | 0 | 0 | 0 | 0 | 2 | 2 | 0 | 0 |
| Hydrazone of synthesis ex. 5 | 0 | 0 | 0 | 0 | 3 | 3 | 3 | 3 | 0 | 0 | 3 | 3 |
| Trimethylolpropane triacrylate | 100 | 100 | 100 | 100 | 100 | 100 | 100 | 100 | 100 | 100 | 100 | 100 |
| Properties of hardened bodies | | | | | | | | | | | | |
| Thickness of cured films (mm) | 12 | 10 | 11 | 12 | 15 | 15 | 11 | 11 | 12 | 13 | 15 | 17 |
| Shore hardness of the upper surface of hardened bodies | 92 | 91 | 91 | 90 | 94 | 96 | 91 | 94 | 92 | 90 | 90 | 94 |
| Shore hardness of the lower surface of hardened bodies | 85 | 82 | 87 | 88 | 88 | 83 | 87 | 88 | 88 | 86 | 85 | 97 |

TABLE 6

| | Example No. | | | | Comparative Example No. | | | |
|---|---|---|---|---|---|---|---|---|
| | 40 | 41 | 42 | 43 | 3 | 4 | 5 | 6 |
| Components of compositions | | | | | | | | |
| Camphorquinone | 0.4 | 0.4 | 0.4 | 0.4 | 0.4 | 0.4 | 0.4 | 0.4 |
| Triphenyl silane | 1 | 1 | 1 | 1 | 0 | 0 | 0 | 0 |
| Hydrogenated dicyclopentadienyl diacrylate (DCP-A) | 100 | 0 | 0 | 0 | 100 | 0 | 0 | 0 |
| Pentaerythritol triacrylate | 0 | 100 | 0 | 0 | 0 | 100 | 0 | 0 |
| PO-modified trimethylolpropane triacrylate (Aronix M-310) | 0 | 0 | 100 | 0 | 0 | 0 | 100 | 0 |
| 2,2-bis(4-acryloxydiethoxyphenyl)propane | 0 | 0 | 0 | 100 | 0 | 0 | 0 | 100 |
| Properties of hardened bodies | | | | | | | | |
| Thickness of cured films (mm) | 9 | 9 | 9 | 11 | 8 | 8 | 4 | 8 |
| Shore hardness of the upper surface of hardened bodies | 76 | 69 | 44 | 44 | 40 | 37 | 17 | 12 |
| Shore hardness of the lower surface of hardened bodies | 74 | 55 | 60 | 38 | 41 | 43 | 55 | 12 |

Notes:
Aronix M-310 is a trademark of Toagosei Chemical Industry Co., Ltd.
DCP-A is a commercial product of Kyoeisha Chemical Co., Ltd.

TABLE 7

| | Example Nos. | | | | | | | | | | | | Comparative Example Nos. | | | | |
|---|---|---|---|---|---|---|---|---|---|---|---|---|---|---|---|---|---|
| | 44 | 45 | 46 | 47 | 48 | 49 | 50 | 51 | 52 | 53 | 54 | 55 | 7 | 8 | 9 | 10 | 11 |
| Components of compositions | | | | | | | | | | | | | | | | | |
| Camphorquinone | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 |
| Hydrazone of synthesis ex. 6 | 3 | 0 | 0 | 3 | 0 | 0 | 0 | 3 | 0 | 0 | 0 | 0 | 0 | 0 | 0 | 0 | 0 |
| Hydrazone of synthesis ex. 7 | 0 | 3 | 0 | 0 | 3 | 0 | 0 | 0 | 0 | 3 | 0 | 0 | 0 | 0 | 0 | 0 | 0 |
| Hydrazone of synthesis ex. 8 | 0 | 0 | 0 | 0 | 0 | 0 | 3 | 0 | 0 | 0 | 0 | 0 | 0 | 0 | 0 | 0 | 0 |
| Hydrazone of synthesis ex. 1 | 0 | 0 | 3 | 0 | 0 | 3 | 0 | 0 | 3 | 0 | 3 | 3 | 0 | 0 | 0 | 0 | 0 |
| 2,2-bis(4-acryloxydiethoxyphenyl)propane | 100 | 100 | 100 | 0 | 0 | 0 | 0 | 0 | 0 | 0 | 0 | 0 | 100 | 0 | 0 | 0 | 0 |
| PO-modified trimethylolpropane triacrylate (Aronix M-310) | 0 | 0 | 0 | 100 | 100 | 100 | 0 | 0 | 0 | 0 | 0 | 0 | 0 | 100 | 0 | 0 | 0 |
| Trimethylolpropane triacrylate | 0 | 0 | 0 | 0 | 0 | 0 | 100 | 50 | 50 | 0 | 0 | 0 | 0 | 0 | 50 | 0 | 0 |
| Tris(acryloxyethyl)isocyanurate | 0 | 0 | 0 | 0 | 0 | 0 | 0 | 50 | 50 | 0 | 0 | 0 | 0 | 0 | 50 | 0 | 0 |
| Hydrogenated dicyclopentadienyl diacrylate | 0 | 0 | 0 | 0 | 0 | 0 | 0 | 0 | 0 | 100 | 100 | 0 | 0 | 0 | 0 | 100 | 0 |
| Dipentaerythritol hexaacrylate | 0 | 0 | 0 | 0 | 0 | 0 | 0 | 0 | 0 | 0 | 0 | 100 | 0 | 0 | 0 | 0 | 100 |
| Properties of hardened bodies | | | | | | | | | | | | | | | | | |
| Thickness of cured films (mm) | 15 | 13 | 13 | 13 | 13 | 12 | 7 | 40 | 40 | 15 | 11 | 19 | 8 | 4 | 7 | 8 | 7 |
| Shore hardness of the upper surface of hardened bodies | 74 | 83 | 85 | 59 | 81 | 70 | 95 | 89 | 90 | 94 | 95 | 93 | 12 | 17 | 11 | 40 | 35 |

TABLE 7-continued

| | Example Nos. | | | | | | | | | | | | Comparative Example Nos. | | | | |
|---|---|---|---|---|---|---|---|---|---|---|---|---|---|---|---|---|---|
| | 44 | 45 | 46 | 47 | 48 | 49 | 50 | 51 | 52 | 53 | 54 | 55 | 7 | 8 | 9 | 10 | 11 |
| Shore hardness of the lower surface of hardened bodies | 52 | 78 | 80 | 60 | 79 | 70 | 91 | 64 | 91 | 90 | 87 | 84 | 12 | 55 | 11 | 40 | 31 |

TABLE 8

| | Example Nos. | | | | Comparative Example Nos. | | |
|---|---|---|---|---|---|---|---|
| | 56 | 57 | 58 | 59 | 12 | 13 | 14 |
| Components of compositions | | | | | | | |
| Camphorquinone | 0.4 | 0.4 | 0.4 | 0.4 | 0.4 | 0.4 | 0.4 |
| Hydrazone of synthesis ex. 5 | 1 | 0 | 0 | 0 | 0 | 0 | 0 |
| Hydrazone of synthesis ex. 6 | 0 | 3 | 0 | 0 | 0 | 0 | 0 |
| Triphenyl silane | 0 | 0 | 1 | 0 | 0 | 0 | 0 |
| Trihexyl silane | 0 | 0 | 0 | 1 | 0 | 0 | 0 |
| Dimethylaminoethyl methacrylic | 0 | 0 | 0 | 0 | 1 | 0 | 0 |
| Triethylamine | 0 | 0 | 0 | 0 | 0 | 1 | 0 |
| Tri-n-butylamine | 0 | 0 | 0 | 0 | 0 | 0 | 1 |
| Trimethylolpropane triacrylate | 100 | 100 | 100 | 100 | 100 | 100 | 100 |
| Properties of hardened bodies | | | | | | | |
| Disconfort odor | none | none | none | none | exist | exist | exist |
| Thickness of cured films (mm) | 9 | 40 | 9 | 10 | 15 | 17 | 13 |
| Shore hardness of the upper surface of hardened bodies | 91 | 89 | 92 | 91 | 92 | 45 | 29 |
| Shore hardness of the lower surface of hardened bodies | 90 | 87 | 70 | 90 | 88 | 60 | 25 |

The present photopolymerizable composition which is obtained by blending the present catalytic composition for photopolymerization with a radical-polymerizable vinyl compound exhibits excellent thick film cureability with light irradiation, and the hardened body of the photopolymerizable composition is high in hardness.

In other words, the present catalytic composition for photopolymerization is markedly improved in photopolymerization activity, compared with conventional catalysts. The present photopolymerizable composition containing the present catalytic composition for photopolymerization is very useful as a coating, an adhesive, a filler, a sealing agent, a material for shaped articles, and the like.

We claim:

1. A catalytic composition for photopolymerization, which comprises an alpha-diketone and a hydrazone, said hydrazone being obtained by dehydration-condensation of a carbonyl compound and an arylsulfonyl hydrazide represented by the formula $Z-NHNH_2$ wherein Z is an arylsulfonyl group containing up to 20 carbon atoms.

2. A catalytic composition according to claim 1, in which said alpha-diketone is a compound having the following formula (A):

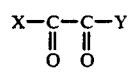

(A)

wherein X and Y, which may be identical with or different from each other, represent a substituted or unsubstituted alkyl, alkenyl or aryl group, or X and Y may form a ring structure by linkage with each other.

3. A catalytic composition according to claim 1, which comprises 1-99% by weight of said alpha-diketone and 99-1% by weight of said hydrazone.

4. A catalytic composition according to claim 1, which comprises 2-90% by weight of said alpha-diketone and 98-10% by weight of said hydrazone.

5. A photopolymerizable composition which comprises a vinyl compound capable of radical polymerization and a catalytic composition which comprises an alpha-diketone and a hydrazone, said hydrazone being obtained by dehydration-condensation of a carbonyl compound and an arylsulfonyl hydrazide represented by the formula $Z-NHNH_2$ wherein Z is an arylsulfonyl group containing up to 20 carbon atoms.

6. A photopolymerizable composition according to claim 5, which comprises 100 parts by weight of said vinyl compound and 0.01-30 parts by weight of said catalytic composition.

7. A photopolymerizable composition according to claim 5, which comprises 100 parts by weight of said vinyl compound and 0.05-20 parts by weight of said catalytic composition.

8. A photopolymerizable composition according to claim 5, which comprises 100 parts by weight of said vinyl compound and 0.05-10 parts by weight of said catalytic composition.

* * * * *